United States Patent
Cavallini et al.

(10) Patent No.: US 7,320,283 B2
(45) Date of Patent: Jan. 22, 2008

(54) NANOPRINTING METHOD

(75) Inventors: Massimiliano Cavallini, Vergato (IT); Fabio Biscarini, Bologna (IT)

(73) Assignee: Consiglio Nazionale Delle Ricerche, Rome (IT)

( * ) Notice: Subject to any disclaimer, the term of this patent is extended or adjusted under 35 U.S.C. 154(b) by 0 days.

(21) Appl. No.: 10/528,378

(22) PCT Filed: Sep. 15, 2003

(86) PCT No.: PCT/EP03/10242

§ 371 (c)(1), (2), (4) Date: Aug. 29, 2005

(87) PCT Pub. No.: WO2004/025367

PCT Pub. Date: Mar. 25, 2004

(65) Prior Publication Data

US 2006/0027117 A1    Feb. 9, 2006

(30) Foreign Application Priority Data

Sep. 16, 2002 (IT) .............................. MI02A1961

(51) Int. Cl.
*B41C 33/00* (2006.01)

(52) U.S. Cl. ............... 101/483; 101/327; 101/487; 101/486; 101/483; 977/887; 977/892

(58) Field of Classification Search ............. 101/327, 101/483, 485, 486, 487; 977/887, 892
See application file for complete search history.

(56) References Cited

U.S. PATENT DOCUMENTS

| | | | | |
|---|---|---|---|---|
| 5,900,160 | A * | 5/1999 | Whitesides et al. | 216/41 |
| 6,713,238 | B1 * | 3/2004 | Chou et al. | 430/322 |
| 6,921,615 | B2 * | 7/2005 | Sreenivasan et al. | 430/22 |
| 6,932,934 | B2 * | 8/2005 | Choi et al. | 264/496 |
| 6,954,275 | B2 * | 10/2005 | Choi et al. | 356/614 |
| 7,077,992 | B2 * | 7/2006 | Sreenivasan et al. | 264/496 |
| 2002/0042027 | A1 * | 4/2002 | Chou et al. | 430/322 |
| 2002/0053296 | A1 * | 5/2002 | Verschueren et al. | 101/424 |

(Continued)

OTHER PUBLICATIONS

B. Messer et al: "Microchannel networks for Nanowire Patterning" J. Am.Chem. Soc., vol. 122, Sep. 29, 2000, pp. 10232-10233, XP002274037 the whole document.

(Continued)

*Primary Examiner*—Ren Yan
*Assistant Examiner*—Matthew Marini
(74) *Attorney, Agent, or Firm*—Andrew Wilford

(57) ABSTRACT

Patterns of nanometer and micrometer dimensions are printed on a substrate by first forming a solution or suspension of a liquid and a printing material and then applying a layer of the solution or suspension to the substrate. Then, without applying pressure, a stamp provided with relief patterns is positioned at a distance of 0 nm to 500 μm from the substrate with the relief patterns in contact with the layer of the solution or suspension. The liquid is then evaporated from the solution or suspension from between the substrate and the stamp so as to draw the suspension or solution by capillarity to the relief patterns and deposit the material on the substrate in accordance with the relief patterns of the stamp. Thereafter the stamp is separated from the substrate.

18 Claims, 3 Drawing Sheets

U.S. PATENT DOCUMENTS

2003/0148024 A1* 8/2003 Kodas et al. .............. 427/125
2004/0118809 A1* 6/2004 Chou et al. .................. 216/40

OTHER PUBLICATIONS

O. Cherniavskaya et al.: "Edge Transfer Lithography of Molecular and Nanoparticle Materials" Langmuir (USA), Langmuir, American Chem. Soc, USA, vol. 18, Aug. 9, 2002, pp. 7029-77034, XP002274038 ISSN: 0743-7463 the whole document.

Xia Y et al: Soft Lithography Annual Review of Materials Science, Annual Reviews Inc., Palo Alto, CA, US, vol. 28, 1998, pp. 153-184, XP009023786 ISSN: 0084-6600 p. 173—p. 174; figure 5d.

Chou S Y et al: "Lithography Induced Self-Construction of Polymer Microstructures for Resistless Patterning" Applied Physics Letters, American Institute of Physics, New York, US, vol. 75, No. 7, Aug. 16, 1999, pp. 1004-1006, XP000875558 ISSN: 0003-6951.

Deshpande P et al: "Lithographically induced self-assembly of microstructures with a liquid-filled gap between the mask and polymer surface" J. Vac Sci. Technol. B, Microelectron. Nanometer Struct. (USA), Journal of Vacuum Science & Technology B (Microelectronics and Nanometer Structures), Nov. 2001, AIP for American Vacuum Soc, USA, vol. 19, No. 6, Dec. 2001, pp. 2741-2744, XP002274039 ISSN: 0734-211X cited in the application.

* cited by examiner

NANOPRINTING METHOD

CROSS REFERENCE TO RELATED APPLICATIONS

This application is the US national phase of PCT application PCT/EP2003/010242 filed 15 Sep. 2003 with a claim to the priority of Italian patent application MI2002A001961 itself filed 16 Sep. 2002.

TECHNICAL FIELD

The present invention relates to a method for manufacturing and controlling the dimensions on the micrometer and nanometer scale of electrodes, periodic structures and patterns in general.

BACKGROUND ART

Some of the possible fields of application of the process according to the invention are the following:

the production of nanometer-size electrodes by using solutes capable of conducting electric current (e.g. metals in colloidal suspension, conducting polymers and molecules, coordination compounds, et cetera);

the production of micro- and nanostructured devices by using "electroactive" materials (i.e., materials having particular electrical properties, e.g. organic and polymeric semiconductors);

the anisotropic or isotropic molding of material deposited on any thin film, substrate and/or device;

the local etching and/or direct patterning of a substrate by using solutions that are reactive with respect to the substrate;

the transfer of periodic patterns that leads to the manufacture of arrays useful for photonics or for creating templating substrates;

the manufacture of rewritable and non-rewritable memory elements;

the forming of supramolecular systems (for example, directed assembly of oriented fibrils of conjugated molecules) by exploiting the self-organization properties of a solute.

Among non-conventional methods (i.e., methods alternative to those based on photolithographic processes) for manufacturing electrodes, patterns and structures with periodic and nonperiodic features, contact printing and nanoimprinting (embossing) are among the most promising, particularly for manufacturing organic integrated circuits. This is due to the simplicity of the approach, the limited number of processes involved, the low requirements in terms of energy, cleanliness of the environment and chemical reagents, the potential to upscale the printing process in a form that is cyclic, automated and repeatable a large number of times, et cetera. These methods, described for example in Chou, U.S. Pat. No. 5,772,905, dated Jun. 30, 1998 and entitled "Nanoimprint lithography" and in Whitesides et al., U.S. Pat. No. 5,900,160, dated May 4, 1999 and entitled "Methods of etching articles via microcontact printing", are used to imprint nanometer-sized structures directly on a film of polymeric material, or to deposit a resist thin film with submicrometer spatial definition. The printed materials are then subjected to a developing process and to several subsequent steps (e.g. lift-off, deposition of the material of interest on the mask) in order to form the printed pattern of the relevant material (which is generally different from the printed material). In the field of nanotechnology research, the European Union has allocated 1300 million euros in the Sixth Framework Programme, started in 2003.

The success of a technology depends not only on the particular properties of the processed material and of the device but also on its effectiveness, simplicity and cost.

The aim of the present invention is to provide a printing process that allows to manufacture, manipulate and organize a variety of soluble materials (e.g. molecules, macromolecules, polymers, colloids) with downscaling of the dimensions of the patterns that are present on the stamp used. Such a process is also suitable for facilitating chemical reactions, or to promote re-organization processes (such as re-crystallisation, dewetting) that occur in small volumes (picoliters).

Other objects of the invention are:

to provide a process that can be performed on a large scale, is repeatable for a large number of cycles, and can be engineered in an existing and commercially viable manufacturing technology;

to provide a process that allows to manufacture, modify, improve, manipulate and give organization and structural order of the molecules of a thin film of soluble materials, with a spatial resolution from one micrometer to tens of nanometers;

to provide a process for manufacturing thin films of conjugated materials with specific properties of anisotropy of structural, electrical, optical and optoelectronic properties that is effective and simple and has low production costs.

This aim and these and other objects that will become better apparent from the description that follows are achieved by a process as defined in the claims.

DISCLOSURE OF THE INVENTION

The printing process for obtaining patterns of nanometer and micrometer dimensions on a substrate according to the present invention includes the steps of i) applying a solution or a suspension of the material of interest on said substrate, ii) the placement, without applying pressure, of a stamp that is provided with patterns in relief at a distance of 0 nm to 500 µm from the substrate, and iii) the evaporation of the solvent from the said solution or suspension.

The present invention develops a very general, unconventional lithographic process for generating, modifying, improving and favoring chemical reactions and for providing organization and order of soluble materials on a variety of surfaces.

The method consists in directing with a stamp the formation of a structured fluid film of solution containing any soluble substance, including conjugated molecules, polymers, supramolecules and colloids, on any surface. The use of solutes that exhibit strong anisotropic properties can entail structural anisotropy and anisotropy of the physical properties of the resulting printed patterns. However, long-range anisotropy and or low-dimensionality (e.g. line or dot shapes) can be imposed to any soluble material with the present method.

The confinement of the solution in small volumes whose shape is imposed by the printing process can determine and/or favor chemical reactions or physical aggregation processes that are otherwise not favored (for example the forming of fibrils, anisotropic crystals, et cetera); the process can therefore be used to provide a suitable reaction environment in the context of the so-called nanochemistry.

The process occurs by means of the mutual approach, with or without contact, of a stamp and a surface in the presence of a solution or suspension. The relief parts of the stamp (protrusions and their pattern) guide the wetting of the substrate by capillarity in the last steps of the evaporation of the solvent. The stamp can consist of either a rigid material (for example metal, silicon, hard plastic, metal-coated plastic) or a soft material (for example elastomeric polymers).

The evaporation of the solvent causes the solidification of the solute by precipitation, polymerization, aggregation processes (for example self-assembly, self-organization, et cetera).

This type of process, differently from other printing processes (such as embossing, microtransfer molding, et cetera), can facilitate:

the deposition of suspensions or the precipitation of solute;

the crystallization of solute;

diffusion, nucleation, growth and aggregation, and subsequent processes therein (e.g. re-crystallisation, dewetting) of a material within the printed region;

chemical reactions in solution localised to the printed regions.

The dimensions of the imprinted pattern depend on the dimensions of the structures that are present on the stamp. Furthermore, due to the evaporation of the solvent, the lateral dimensions of the imprinted pattern can be reduced with respect to those of the pattern that is present on the stamp.

The effectiveness of the process depends on the characteristics of the stamp (material, distance at which the stamp is placed, shape, adhesiveness and hardness) and on the type of solution (combination of solute and solvent, partial pressure of the solvent, temperature, material of the stamp, wettability of the solute with respect to the surface, concentration, viscosity, et cetera).

The effect of the process described hereinafter is demonstrated on spatial scales from micrometer ($10^{-6}$ m) to nanometer ($10^{-9}$ m) length scales.

The process can be applied to any type of soluble material in any type of solvent on any type of surface.

Examples that are nonlimitative for the present invention of imprinting materials that can be used are tris-(quinoline) aluminum(III) ($AlQ_3$), rotaxanes, polythiophenols, phthalocyanines, soluble polymers or precursors of polymers such as polyaniline, polyphenylene vinylene, poly-(3-alkyl-thienyl), colloidal nanoparticles, such as Au or Ag, coordination compounds and metal clusters.

The process according to the present invention is the first and only method that proposes an unconventional method that allows to down scale by an order of magnitude of the spatial length scales the dimensions of the stamp's features.

The degree of reduction that can be obtained depends on the initial concentration of the solution or suspension used for imprinting, on the surface wettability properties of the solute, on the characteristics of the stamp, and on the particular properties of the solute.

The process according to the present invention is described in relation to the following figures:

FIG. 1 is a schematic view of the main steps of the process.

a) Initial step of application of a solution or suspension on a substrate; the solution or suspension can also be applied on the stamp and the stamp can then be placed over the substrate.

b) Printing step, in which the patterns of the stamp guide by capillarity the solution or suspension. If saturation of the solution, or polymerization of the dissolved or suspended polymer, or deposition of the suspended solids (colloids) is achieved already at this step, it is possible to print a continuous film of the solute (or polymer or colloid), with the patterns provided on said film (result R1). This result is already known and published in the literature (S. Y. Chou: Lithographically induced self-assembly of microstructures with a liquid-filled gap between the mask and polymer surface. Journal of Vacuum Science Technology B Volume: 19 (6) pages 2741-2744, 2001), and is not the subject of the present patent.

c) Step of concentration of the solution or suspension, guided by the relief patterns of the stamp. If saturation of the solution or suspension is achieved or polymerization occurs in this step, only the patterns of solute (or polymer or colloid) are provided on the surface, optionally with a reduction of their dimensions. There is no material between the imprinted patterns (result R2).

d) In the case of particularly diluted solutions or suspensions, the fine structure of the patterns can in turn generate its own structures on the film. The size of the models obtained can be down scaled by reducing appropriately the initial concentration of the solution or suspension. If saturation of the solution or suspension is achieved or if polymerization occurs in this step, only the structures that are present in the patterns of the stamp are reproduced on the imprinted film; as in result R2, there is no material between the imprinted patterns (result R3).

FIGS. 2 and 3 illustrate two examples of application of the imprinting method, with results R2 and R3, according to the present invention.

The physical principle of the process is based on the capillarity of liquids, which tend to accumulate at the sharper edges in order to minimize free surface energy. The edges of protrusions, moreover, pin the line of contact of the fluid front with the surface. This line would move due to the evaporation of the solvent. Immobilization establishes a capillary flow, with convective transport and subsequent accumulation of solute toward the regions where the thickness of the solution decreases due to evaporation.

In the method according to the invention, during the evaporation step the amount of solution or suspension decreases until it constitutes a liquid film on the structure. If, in these conditions, the concentration of the solution or suspension exceeds solubility, or if polymerization or deposition of the dispersed material occurs, one obtains the result R1 shown in FIG. 1. When the amount of solution or suspension is sufficiently small, it accumulates only between the surface and the relief patterns of the stamp, as shown schematically in FIG. 1b. Further evaporation causes the concentration of the solution or suspension until precipitation of the solute or of the dispersed material begins in the regions where the solution or suspension has migrated due to capillarity.

The reduction of the lateral dimension of the patterns is determined by the smaller volume of the precipitate with respect to the solution or suspension.

By choosing appropriately the initial concentration of the solution or suspension, it is possible to determine in which step of the process one achieves saturation of the solution or deposition of the suspended material and therefore the actual reduction of the dimensions of the patterns during printing. It is therefore possible to determine:

the forming of a homogeneous film with the patterns of the stamp reproduced on the surface (in general, this event occurs starting from solutions that are already close to saturation);

the deposition of the solute or suspension only at the relief patterns that are present on the stamp (i.e., a positive replica of the stamp);

the reduction of the dimensions of the imprinted structures with respect to the dimensions of the original patterns of the stamp.

The effectiveness of the process depends on the combination of the temperature T during printing, on the duration of the printing, on the speed at which the stamp is removed and on the distance between the patterns of the stamp and the surface (this distance is controlled by means of pre-patterned spacers).

The protrusions of the stamp intervene in the process for nanostructuring the deposit. By working with sufficiently diluted solutions, it is possible to deposit the structures only at the edges of the protrusions, while for higher concentrations deposition occurs at the position and across the entire protrusion. Thus, the outcome is the modulation of the information transferred from the stamp that can be controlled by the concentration of the solution.

The temperature T and the ambient pressure P must be such as to allow the evaporation of the solvent.

The duration of the printing is generally on the order of a few seconds and is closely linked to the volatility of the solvent. The pressure and temperature values vary depending on the materials and on the thickness of the film.

As regards the distance at which the stamp is arranged with respect to the substrate during printing, it is possible:

to use suitable spacers (for example, they can be grown by evaporation on masks or by means of any other process, e.g., nanoparticle deposition);

to use stamps constituted by thin films (for example metallized films of polymers, thin metal foils, et cetera) that can float on the solution. In this case, the distance of the stamp from the substrate is self-adjusting.

As regards determining the distance between the stamp and the substrate and the relation between the imprinting parameters, once the materials, i.e., the substrate, the solvent and the imprinting material, have been determined, the density (g/dm$^3$), molecular weight (g/mol) and saturation concentration (mol/dm$^3$) or concentration at which the solute or suspended fraction starts to precipitate are determined automatically. The variable elements of the process are: total area of the protrusions or patterns of the stamp (m$^2$); distance at which the stamp is placed with respect to the substrate (m); initial concentration of the solution (mol/dm$^3$); initial volume of the solution (m$^3$).

The following equation is based on the mass balance and establishes the relationships among the parameters of the process.

$$\frac{C_i}{C^*} = h \frac{A}{V_i}$$

where "$C^*$" is the concentration at which saturation is reached; "$C_i$" is the initial concentration of the solution; "h" is the distance between the stamp and the substrate; "A" is the total area of the patterns of the stamp; and "$V_i$" is the initial volume of the solution.

The parameters must meet the following conditions:

1. $h \leq 500 \ \mu m$.

2. $C^* \geq \frac{dhA}{V_i Pm}$, i.e., the concentration must not saturate the solution before it has gathered only under the protrusions of the stamp.

For example, assuming a solution that is 100 times more diluted than the saturation concentration, and using 10 μl to print across 1 cm$^2$, one would have to place the stamp at a distance of $$\frac{10^{-2} C^*}{C^*} = h \frac{10^{-4} m^2}{10^{-8} m^3} \Rightarrow h = \frac{10^{-2} 10^{-8}}{10^{-4}} = 10^{-6} m = 1 \mu m$$

In order to be in the conditions for reducing the dimensions of the imprinted patterns it is sufficient to reduce independently $V_i$ and/or $C_i$ by appropriate values or to increase h.

A priori, there are no limitations in principle that indicate preference for one of the three parameters, if conditions 1 and 2 cited above remain unchanged.

In principle, the initial thickness of the solution is not relevant for the goals of the process.

The limits that can be attained regarding the reduction of the process depend specifically on the properties of the particular system, such as wettability of the substrate with respect to the solute and the solvent, size of the molecules of the solute (or size of the dispersed particles for suspensions), self-organization capability, nucleation (homo- or heterogeneous), and growth.

The process described in the present invention is demonstrated with stamps that contain periodic patterns. The most general case of the present invention consists of a stamp with multiple protrusions or with more complex fabricated structures.

The stamps used can be hard stamps, made for example of chromium, steel, silicon oxide, polymethyl metacrylate, polycarbonate. It is also possible to use stamps made of elastomeric material, for example polydimethyl siloxane, and stamps constituted by thin films.

The following examples are given in order to illustrate the present invention in a non-limitative manner.

EXAMPLES

Example 1

Printing of a Film of tris-(hydroxyquinoline) Aluminum(III) (AlQ$_3$) on Silicon This example uses as printing material an organic complex of AlQ$_3$ solubilized in dichloromethane (CH$_2$Cl$_2$).

AlQ$_3$ is among the most important organic material for the industrial manufacture of organic light-emitting diodes (OLEDs). This example can be considered as a step for manufacturing structured OLEDs.

The stamp used was a square lamina of metal (in the particular case, gold) with a 5-mm side; the lamina was engraved with a series of parallel lines 400 nm wide, 150 nm deep and with a periodicity of 1.4 μm; the parallel lines constituted the patterns of the stamp. FIG. 2a illustrates atomic-force microscope images of the patterns of the stamp. The vertical scale ranges from 0 (black) to z=158 nm (white).

10 μl of the solution cited above, at two different concentrations obtained respectively by diluting a saturated solution by approximately a factor a) 10$^4$ and b) 3×10$^5$, were deposited on a substrate constituted by a piece, measuring approximately 1 cm², of monocrystalline silicon (111 orientated) with native oxide on the surface.

The distance between the stamp and the surface, calculated with the proposed formula, is 40 nm and was adjusted by means of preset spacers.

FIGS. 2b (case a) and 2c (case b) show atomic-force microscope images of the imprinted patterns.

The two cases correspond respectively to the results R2 (2b) and R3 (2c) shown schematically in FIG. 1 according to the present invention.

In particular: 2b shows patterns of $AlQ_3$ imprinted with a width of 200 nm and a period of 1.4 μm. The vertical scale ranges from 0 (black) to z=45 nm (white). 2c shows a film of an organic compound imprinted with twinned parallel lines 70 nm thick full-width-half maximum. The vertical scale ranges from 0 (black) to z=23 nm (white).

Example 2

Printing of a Film of Rotaxanes on a Silicon Substrate

This example uses a molecule known as rotaxane as printing material. Rotaxanes are relevant to applications in molecular electronics and as nanoscale actuators.

Rotaxanes are a new class of supermolecules, constituted by a macrocycle locked around a linear chain. The structural formula of the rotaxane 1 used is shown.

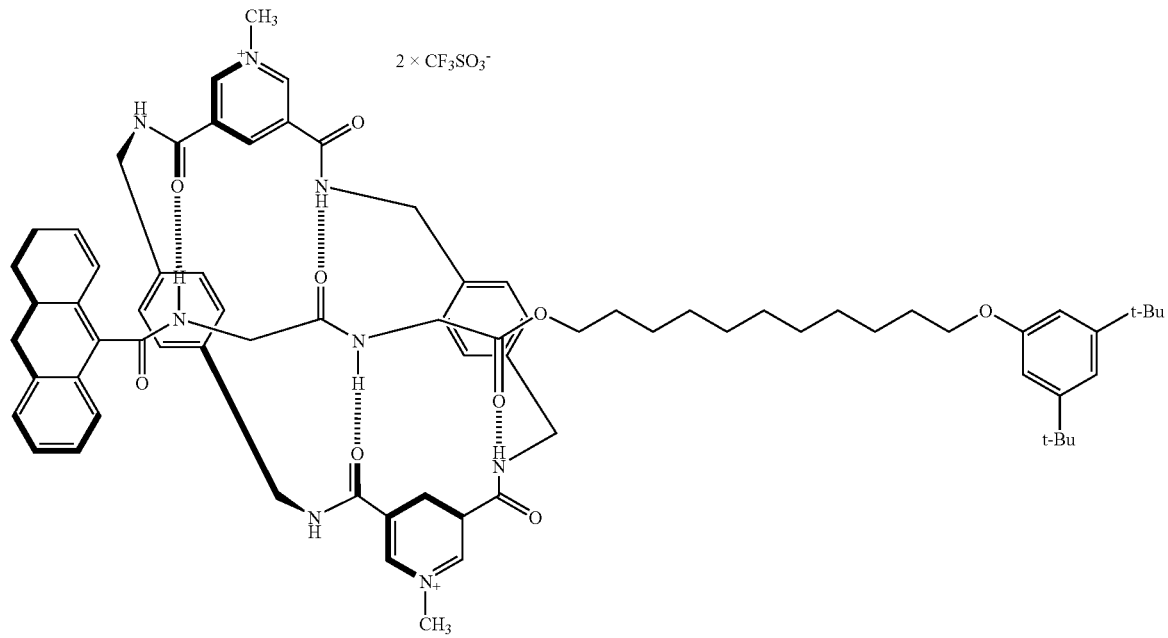

The purpose here is to demonstrate the generality of the method. The stamp used consists of a circular copper grid with a diameter of 3 mm and a thickness of 20 μm. The patterns of the stamp are constituted by a square mesh with cells 10 μm wide and spaced by 20 μm. FIG. 3a is an optical microscope image of the patterns of the stamp.

20 μl and 5 μl of a solution of rotaxane 1 in acetone (concentration 1 g/l) were deposited on a piece of approximately 1 cm² of silicon covered with thermal oxide and modified with a layer of hexamethyl disiloxane on its surface.

In this configuration (i.e., by using a light stamp), the distance between the stamp and the surface is controlled by the floating of the grid on the solution.

FIGS. 3b (20-μl case) and 3c (5-μl case) are atomic-force microscope images of the printed patterns; the two examples correspond to result R2, shown schematically in FIG. 1, but with a different degree of reduction of the printed patterns.

Figure 1:
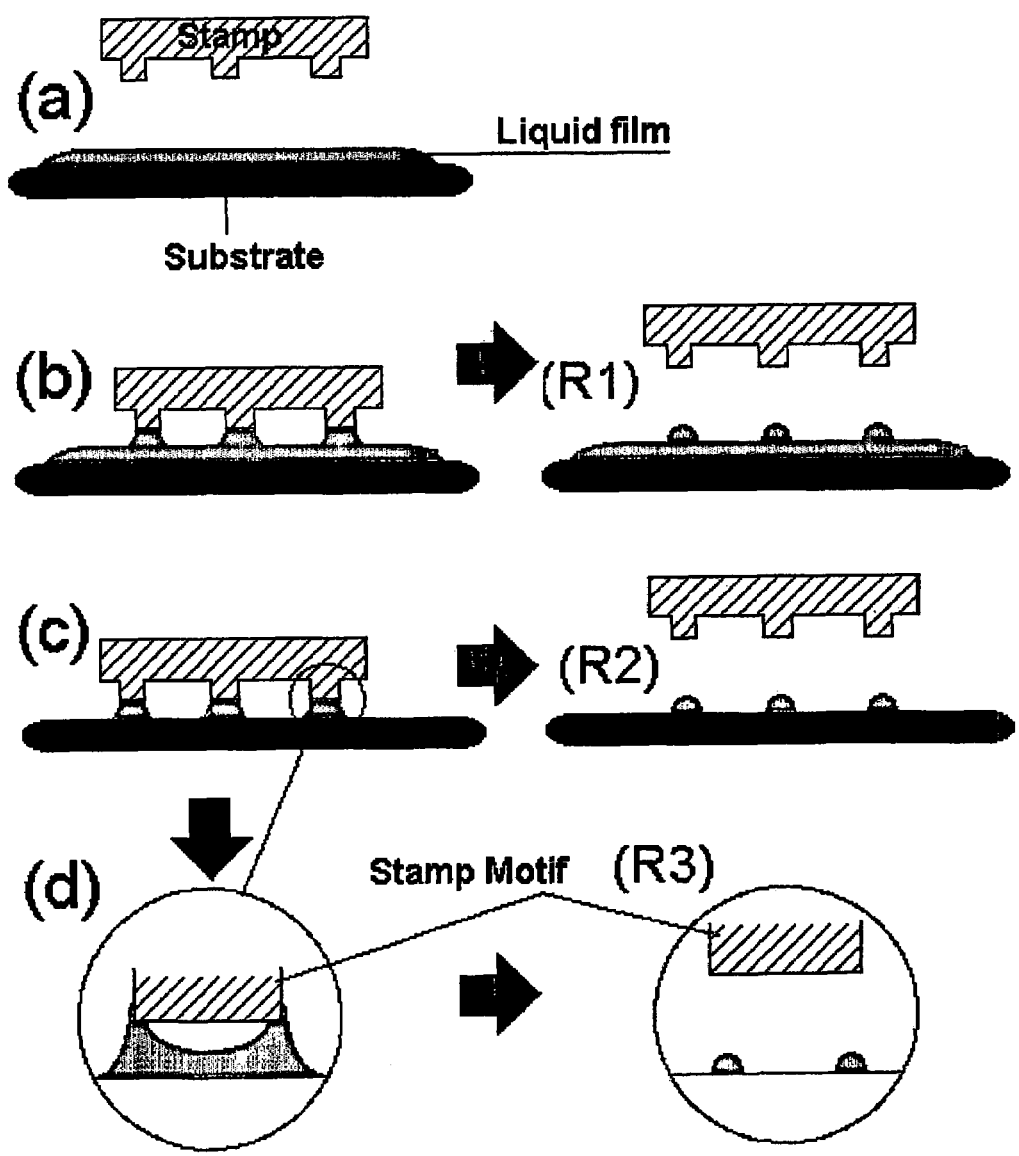
Figure 2:
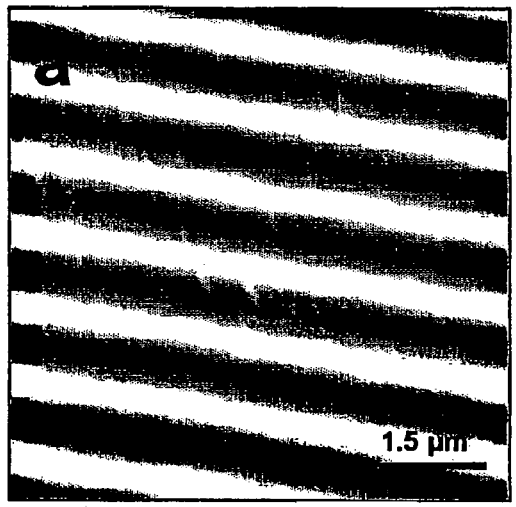
Figure 2:
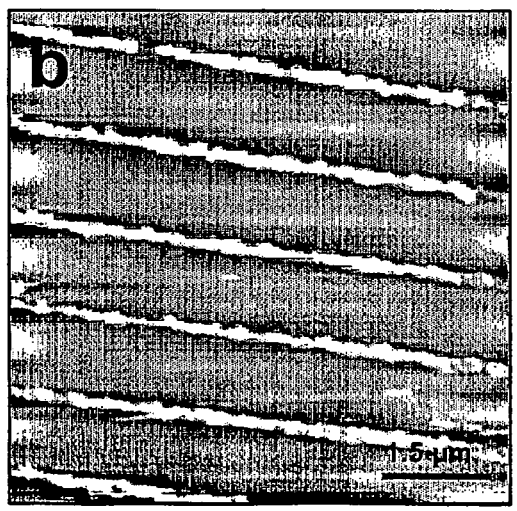
Figure 2:
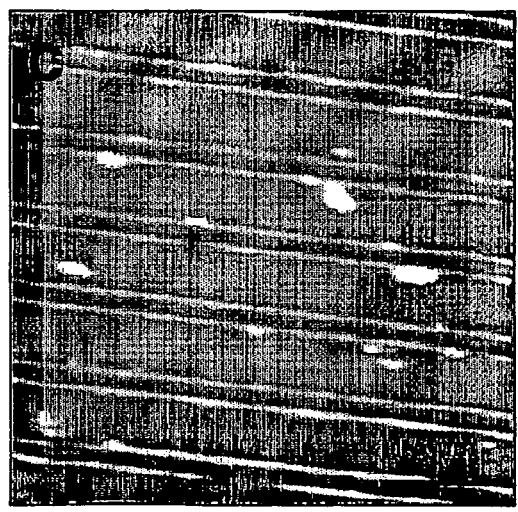
Figure 3:
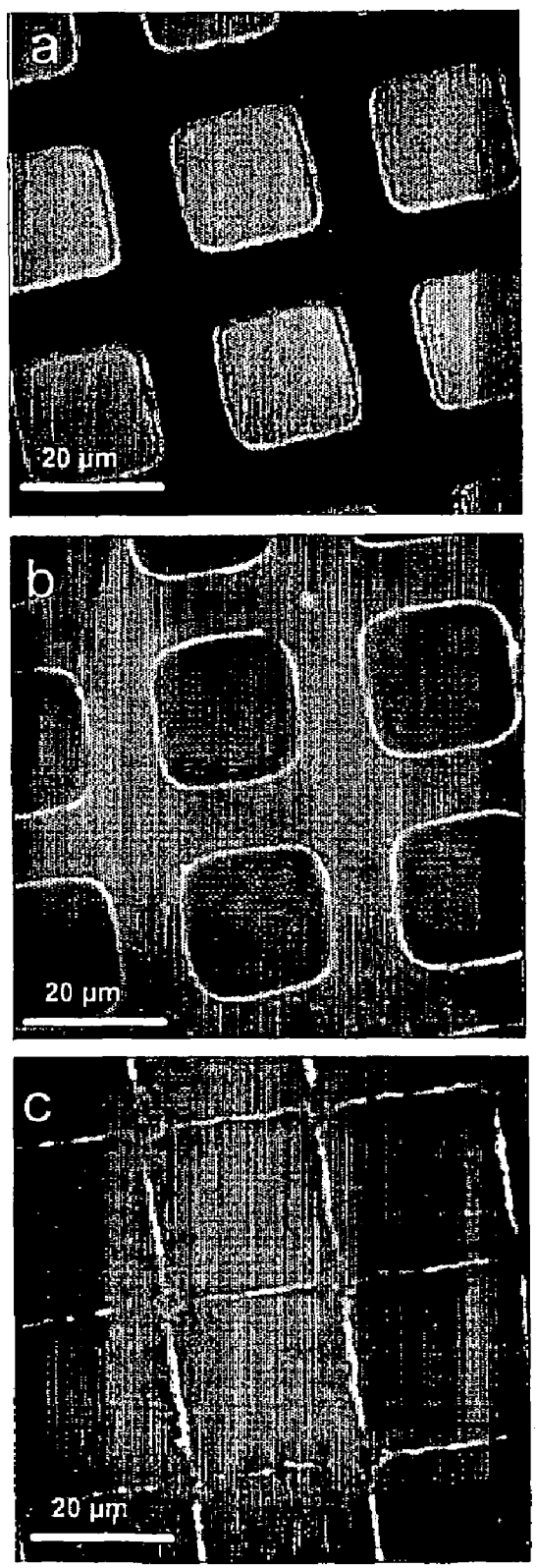
FIG. 3b illustrates a printed film of rotaxane 1 that is 10 μm wide and has a period of 20 μm (in this case there is no reduction in the dimensions of the imprinted patterns with respect to the original imprinted patterns of the stamp). The vertical scale ranges from 0 (black) to z=150 nm (white).
FIG. 3c illustrates a printed film of rotaxane 1 that is 1 μm wide and has a period of 20 μm (in this case, the reduction in the dimensions of the imprinted patterns with respect to the original patterns of the stamp is a factor of 10). The vertical scale ranges from 0 (black) to z=20 nm (white).

The disclosures in Italian Patent Application No. MI2002A001961 from which this application claims priority are incorporated herein by reference.

What is claimed is:

1. A printing process for obtaining patterns of nanometer and micrometer dimensions on a substrate, comprising the steps of sequentially:

forming a solution or suspension of a volatile liquid and a printing material, applying a layer of the solution or suspension to said substrate, positioning, without applying pressure, of a stamp provided with relief patterns at a distance of 0 nm to 500 μm from the substrate with the relief patterns in contact with the layer of the solution or suspension, evaporating only the volatile liquid from said solution or suspension from between the substrate and the stamp without evaporating the printing material so as to draw the suspension or solution by capillarity to the relief patterns and deposit the printing material on the substrate in accordance with the relief patterns of the stamp, and thereafter separating the stamp from the substrate and leaving the printing material on the substrate.

2. The process according to claim 1, wherein said printing material is chosen from the group consisting of soluble polymers or precursors of polymers.

3. The process according to claim 2, wherein said printing material is chosen from the group consisting of polyaniline, polyphenylene vinylene, poly(3-alkyl-thienyl) and mixtures thereof.

4. The process according to claim 1, wherein said printing material is chosen from the group consisting of tris-(quinoline) aluminum, coordination compounds, metallic clusters, rotaxanes, polythiophenes, phthalocyanines, and mixtures thereof.

5. The process according to claim 1, wherein said printing material is chosen from the group consisting of colloidal substances and nanoparticles.

6. The process according to claim 5, wherein said printing material is colloidal Au or Ag.

7. The process according to claim 6, wherein said substrate has a surface area that is orders of magnitude larger than the dimensions of the relief patterns of the stamp.

8. The process according to claim 1, wherein said printing material and/or said solution or suspension is chemically reactive with a surface of said substrate and can produce corrosion chemisorption, grafting or polymerization of the surface.

9. The process according to claim 1, wherein said distance is changed during imprinting.

10. The process according to claim 1, wherein said stamp has multiple protrusions of arbitrary shape and dimensions.

11. The process according to claim 1, wherein said stamp is a hard stamp, made of chromium, steel, silicon oxide, or a polymer like polymethyl methacrylate, or polycarbonate.

12. The process according to claim 1, wherein said stamp is made of elastomeric material.

13. The process defined in claim 12 wherein the printing material is polydimethyl siloxane.

14. The process according to claim 1, wherein said stamp is formed by a thin film of material that floats on said solution.

15. The process according to claim 1, wherein the volatile liquid is evaporated from the suspension or solution at a temperature between −70 and 300 degrees Celsius.

16. The process according to claim 1, wherein said stamp is arranged in an inclined configuration with respect to a surface of said substrate, thus producing on the substrate patterns with a spatially variable thickness.

17. The process according to claim 1, wherein said solution contains multiple printing materials in the form of solutes, said solutes being suitable to precipitate selectively in different times, thus generating controlled nonuniformities of composition in the resulting patterns.

18. The process according to claim 1, wherein said solution contains imprinting materials in amounts suitable to react in reaction volumes on the order of magnitude of picoliters.

* * * * *